(12) United States Patent
Shi

(10) Patent No.: US 12,302,555 B2
(45) Date of Patent: May 13, 2025

(54) METHOD FOR FORMING BIT LINE CONTACT STRUCTURE AND SEMICONDUCTOR STRUCTURE

(71) Applicant: CHANGXIN MEMORY TECHNOLOGIES, INC., Hefei (CN)

(72) Inventor: Xiayu Shi, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 317 days.

(21) Appl. No.: 17/676,283

(22) Filed: Feb. 21, 2022

(65) Prior Publication Data
US 2022/0216217 A1 Jul. 7, 2022

Related U.S. Application Data

(63) Continuation of application No. PCT/CN2021/108202, filed on Jul. 23, 2021.

(30) Foreign Application Priority Data

Jan. 5, 2021 (CN) .......................... 202110005940.X

(51) Int. Cl.
*H10B 12/00* (2023.01)

(52) U.S. Cl.
CPC ......... *H10B 12/485* (2023.02); *H10B 12/315* (2023.02); *H10B 12/34* (2023.02)

(58) Field of Classification Search
CPC ..... H10B 12/485; H10B 12/315; H10B 12/34
See application file for complete search history.

(56) References Cited

U.S. PATENT DOCUMENTS

| 8,716,777 | B2 | 5/2014 | Kim et al. |
| 9,871,045 | B2 | 1/2018 | Yeom |
| 2004/0029324 | A1* | 2/2004 | Park ................... H01L 21/76897 257/E21.507 |
| 2013/0049209 | A1* | 2/2013 | Yeom ................... H10B 12/482 257/E21.585 |

(Continued)

FOREIGN PATENT DOCUMENTS

| CN | 1143393 C | 3/2004 |
| CN | 102969317 A | 3/2013 |

(Continued)

*Primary Examiner* — Kretelia Graham
*Assistant Examiner* — Jaesun Lee
(74) *Attorney, Agent, or Firm* — Kilpatrick Townsend & Stockton LLP

(57) ABSTRACT

Provided is a method for forming a bit line contact structure, including: successively disposing a first mask layer, a second mask layer, and a photoresist on a surface of a substrate on which word lines and a protection layer are provided, patterning the photoresist; successively etching the second and the first mask layers with the patterned photoresist to form a first opening; disposing a sacrificial layer on a surface of the second mask layer to form a second opening having an opening width smaller than that of the first opening; etching a surface of the protection layer to form a third opening with the second opening and meanwhile removing the remaining sacrificial layer to expose the first opening; and etching through the protection layer with the first opening and the third opening to form a bit line contact hole at the surface of the substrate.

13 Claims, 13 Drawing Sheets

(56) References Cited

U.S. PATENT DOCUMENTS

| | | | |
|---|---|---|---|
| 2013/0320558 A1 | 12/2013 | Kim et al. | |
| 2020/0203354 A1* | 6/2020 | Lee | H01L 21/7682 |
| 2021/0217657 A1* | 7/2021 | Ahn | H01L 21/0337 |
| 2022/0052055 A1* | 2/2022 | Chun | H10B 12/482 |
| 2022/0216312 A1* | 7/2022 | Wan | H01L 29/42376 |
| 2022/0344198 A1* | 10/2022 | Chen | H01L 21/0332 |

FOREIGN PATENT DOCUMENTS

| | | | | |
|---|---|---|---|---|
| CN | 105789111 A | | 7/2016 | |
| CN | 110391234 A | | 10/2019 | |
| CN | 110890369 A | | 3/2020 | |
| CN | 111542924 A | | 8/2020 | |
| CN | 111785718 A | | 10/2020 | |
| CN | 112490244 A | * | 3/2021 | H01L 21/76224 |
| CN | 112736036 A | * | 4/2021 | H10B 12/01 |

* cited by examiner

METHOD FOR FORMING BIT LINE CONTACT STRUCTURE AND SEMICONDUCTOR STRUCTURE

CROSS-REFERENCE TO RELATED APPLICATIONS

The application is a continuation application of International Application No. PCT/CN2021/108202, filed on Jul. 23, 2021, which claims priority to Chinese Patent Application No. 202110005940.X, filed on Jan. 5, 2021. The disclosures of International Application No. PCT/CN2021/108202 and Chinese Patent Application No. 202110005940.X are hereby incorporated by reference in their entireties.

TECHNICAL FIELD

The present disclosure relates to the technical field of semiconductors, and in particular to a method for forming a bit line contact structure, and a semiconductor structure.

BACKGROUND

As the critical dimension (CD) of semiconductor integrated circuit devices continues to shrink, the CD of dynamic random access memories (DRAMs) is also becoming smaller and smaller. The manufacturing process is becoming more and more complicated, and the cost is getting higher and higher. Therefore, it is needed to develop a simple and stable manufacturing process to simplify the manufacturing procedure, save the cost, and improve the product performance.

DRAM is a widely used multi-computer system semiconductor memory. As the CD of the semiconductor integrated circuit devices continues to shrink, the area of contact holes is getting smaller and smaller, and the contact resistance of the contact holes is getting larger and larger, so that it is urgent for the current integrated circuit manufacturing process to reduce the contact resistance. In order to meet the above requirement, in the related art, "fin" structures are adopted to increase the contact areas so as to reduce the contact resistance. If the depth of the contact holes is not controlled well, adverse consequences such as short circuit between word lines (WLs) may be easily caused.

SUMMARY

The present disclosure relates to the technical field of semiconductors, and in particular to a method for forming a bit line contact structure, and a semiconductor structure.

An aspect of embodiments of the present disclosure provides a method for forming a bit line contact structure, including: successively disposing a first mask layer, a second mask layer, and a photoresist on a surface of a substrate, on which word lines and a protection layer are provided, and patterning the photoresist; successively etching the second mask layer and the first mask layer by utilizing the patterned photoresist, so as to form a first opening penetrating the first mask layer and the second mask layer; disposing a sacrificial layer on a surface of the second mask layer, which covers sidewalls and a bottom wall of the first opening, so as to form a second opening having an opening width smaller than that of the first opening; etching a surface of the protection layer to form a third opening corresponding to the second opening by utilizing the second opening, and meanwhile removing the remaining sacrificial layer to expose the first opening; and etching through the protection layer by utilizing the first opening and the third opening to form a bit line contact hole at the surface of the substrate, in which the bit line contact hole is configured to form a bit line contact structure, and includes a first hole portion and a second hole portion, the first hole portion opens at the surface of the protection layer, a hole diameter of the second hole portion is smaller than that of the first hole portion, and the second hole portion opens at a bottom wall of the first hole portion.

Another aspect of embodiments of the present disclosure provides a semiconductor structure, in which the semiconductor structure includes a substrate, a bit line contact structure is provide on a surface of the substrate; the bit line contact structure includes a bit line contact hole, the bit line contact hole includes a first hole portion and a second hole portion; the first hole portion opens at the surface of the substrate, a hole diameter of the second hole portion is smaller than that of the first hole portion, and the second hole portion opens at a bottom wall of the first hole portion.

DETAILED DESCRIPTION

Figure 1:
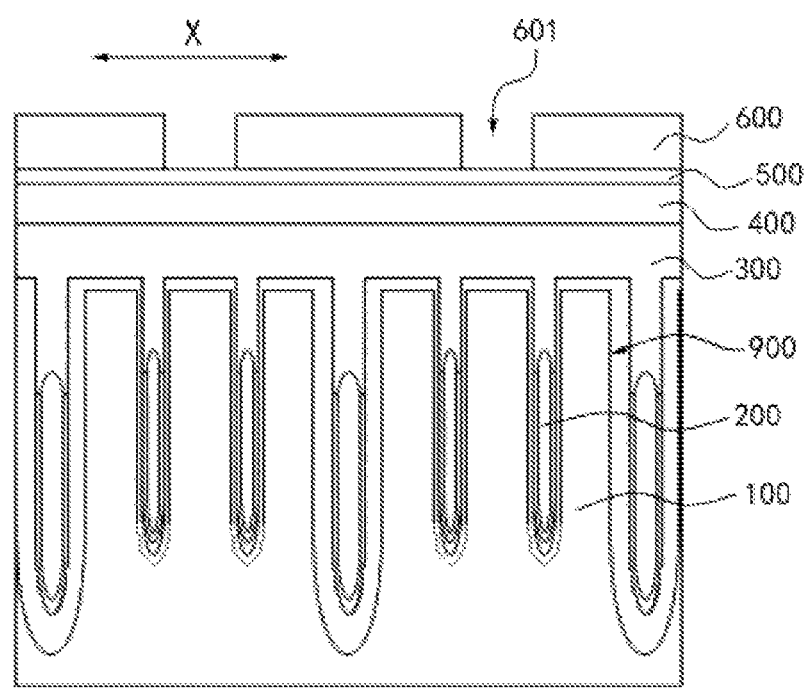
FIG. 1 is a sectional view of a semiconductor structure in a bit line direction in a step of a method for forming a bit line contact structure according to an exemplary embodiment.

The exemplary embodiments will be more fully described with reference to accompanying drawings. However, the exemplary embodiments can be implemented in various forms, and should not be understood as being limited to the embodiments set forth herein. On the contrary, these embodiments are provided so that the present disclosure will be comprehensive and complete, and the concept of the exemplary embodiments is fully conveyed to those skilled in the art. The same reference numerals in the accompanying drawings indicate the same or similar structures, and thus their detailed description will be omitted.

Referring to FIG. 1 to FIG. 12, sectional views of a semiconductor structure in several main steps of a method for forming a bit line contact structure provided by the present disclosure are typically shown. In this exemplary embodiment, the method for forming a bit line contact structure provided by the present disclosure is described by taking a dynamic random access memory device as an example. It is easy for those skilled in the art to understand that, various modifications, additions, substitutions, deletions or other changes may be made to the following specific embodiments in order to apply the relevant design of the present disclosure to a manufacturing procedure process of other types of semiconductor structure. These modifications, additions, substitutions, deletions still fall within the scope of the principle of the method for forming a bit line contact structure provided by the present disclosure.

Specifically, FIG. 1, FIG. 3, FIG. 5, FIG. 7, FIG. 9, and FIG. 11 respectively show sectional views of the semiconductor structure in an extension direction X of a bit line in several main steps of the formation process provided by the present disclosure. Moreover, FIG. 2, FIG. 4, FIG. 6, FIG. 8, FIG. 10, and FIG. 12 respectively show sectional views of the semiconductor structure in an extension direction Y of a word line 200 in the several main steps of the formation process provided by the present disclosure. Moreover, FIG. 1 and FIG. 2 belong to the same step, FIG. 3 and FIG. 4 belong to the same step, FIG. 5 and FIG. 6 belong to the same step, FIG. 7 and FIG. 8 belong to the same step, FIG. 9 and FIG. 10 belong to the same step, and FIG. 11 and FIG. 12 belong to the same step. In addition, referring to FIG. 13 in conjunction, a top view of the semiconductor structure provided by the present disclosure is typically shown. Accordingly, the above sectional views in the extension direction X of a bit line are schematic sectional structure views of the semiconductor structure in the extension direction X of a bit line shown in FIG. 13. The above sectional views in the extension direction Y of a word line 200 are schematic sectional structure views of the semiconductor structure in the extension direction Y of a word line 200 shown in FIG. 13. The process details, manufacture procedure sequence and functional relationship of the main steps of the method for forming a bit line contact structure provided by the present disclosure will be described in detail below with reference to the above accompanying drawings.

As shown in FIG. 1 to FIG. 12, in this embodiment, the method for forming a bit line contact structure provided by the present disclosure includes the following steps.

A first mask layer 400, a second mask layer 500, and a photoresist 600 are successively disposed on a surface of a substrate 100, on which word lines 200 and a protection layer 300 are provided, and the photoresist 600 is patterned.

The second mask layer 500 and the first mask layer 400 are successively etched by utilizing the patterned photoresist 600, so as to form a first opening 401 penetrating the first mask layer 400 and the second mask layer 500.

A sacrificial layer 700 is disposed on a surface of the second mask layer 500. The sacrificial layer 700 covers sidewalls and a bottom wall of the first opening 401, i.e. a second opening 701 having an opening width smaller than that of the first opening 401 is formed.

A surface of the protection layer 300 is etched to form a third opening 301 corresponding to the second opening 701 by utilizing the second opening 701, and meanwhile the remaining sacrificial layer 700 is removed to expose the first opening 401.

The protection layer 300 is etched through by utilizing the first opening 401 and the third opening 301 to form a bit line contact hole 110 in the surface of the substrate 100. The bit line contact hole 110 is configured to form a bit line contact structure (e.g. a plug, etc.), and includes a first hole portion 111 and a second hole portion 112. The first hole portion 111 opens at the surface of the protection layer 300. A hole diameter of the second hole portion 112 is smaller than that of the first hole portion 111. The second hole portion 112 opens at a bottom wall of the first hole portion 111.

By the above process design, the present disclosure can control the shape of the bit line contact hole 110, so that the bit line contact hole 110 is formed with a shape having the first hole portion 111 and the second hole portion 112. The second hole portion 112, of which an opening is formed in the bottom wall of the first hole portion 111, has a smaller hole diameter than the first hole portion 111. Accordingly, the contact area of the bit line contact hole 110 can be increased, thereby the contact resistance is reduced, and the problems in the related art such as short circuit between word lines 200 are avoided. The present disclosure can improve the product performance of semiconductor structures with a relatively simple manufacturing process and a lower cost.

Figure 2:
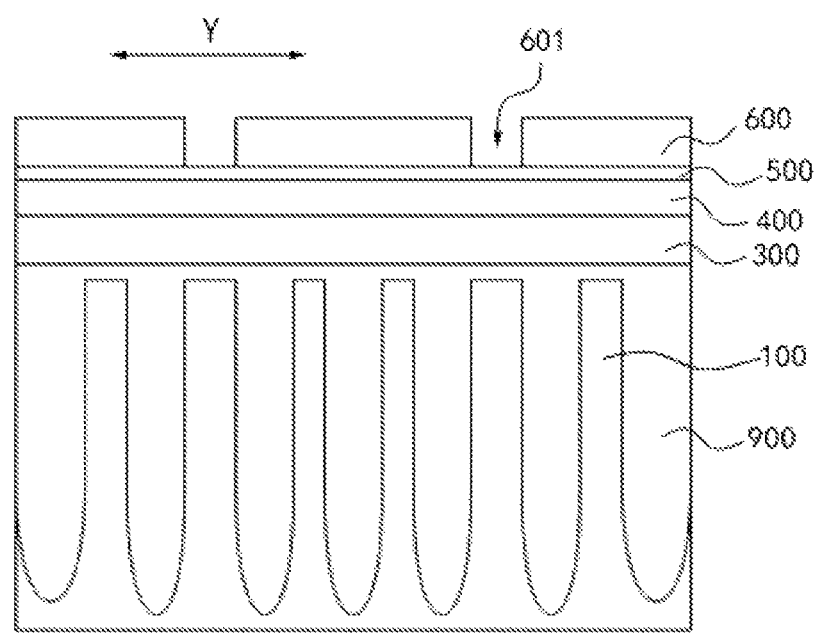
FIG. 2 is a sectional view of the semiconductor structure shown in FIG. 1 in a word line direction.

As shown in FIG. 1 and FIG. 2, sectional structures of the semiconductor structure in the extension direction X of a bit line and in the extension direction Y of a word line 200 in the step of "successively disposing the first mask layer 400, the second mask layer 500, and the photoresist 600, and patterning the photoresist 600" are respectively and typically shown. Specifically, in the above step, the semiconductor structure includes the substrate 100, the first mask layer 400, the second mask layer 500, and the photoresist 600. Word lines 200 are provided in the substrate 100, and the word lines 200 adopt a buried word line structure. A protection layer 300 is provided on the surface of the substrate 100. The first mask layer 400 is disposed on the surface of the protection layer 300. The second mask layer 500 is disposed on the surface of the first mask layer 400. The photoresist 600 is disposed on the surface of the second mask layer 500. A photoresist opening pattern 601 is formed by using a patterning process. The photoresist opening pattern 601 roughly corresponds to an upper portion of the substrate 100 between two word lines 200.

Optionally, as shown in FIG. 1 and FIG. 2, in this embodiment, as for the step of "disposing the first mask layer 400", the first mask layer 400 may be formed on the surface of the protection layer 300 of the substrate 100 by using a deposition process. Further, the above deposition process may be an atomic layer deposition process.

Optionally, as shown in FIG. 1 and FIG. 2, in this embodiment, as for the step of "disposing the second mask layer 500", the second mask layer 500 may be disposed on the surface of the first mask layer 400 by using a deposition process. Further, the above deposition process may be an atomic layer deposition process.

Optionally, as shown in FIG. 1 and FIG. 2, in this embodiment, as for the step of "disposing the photoresist 600", the photoresist 600 may be disposed on the surface of the second mask layer 500 by using a deposition process. Further, the above deposition process may be an atomic layer deposition process.

Optionally, as shown in FIG. 1 and FIG. 2, in this embodiment, as for the step of "patterning the photoresist 600", the photoresist 600 may be patterned by using an exposure process and a developing process to form the photoresist opening pattern 601 from the photoresist 600.

Optionally, as shown in FIG. 1 and FIG. 2, in this embodiment, as for the step of "disposing the first mask layer 400", a material of the first mask layer 400 may include at least one of $Si_3N_4$ or $SiO_2$.

Optionally, as shown in FIG. 1 and FIG. 2, in this embodiment, as for the step of "disposing the second mask layer 500", the second mask layer 500 includes an anti-reflection coating layer.

Figure 3:
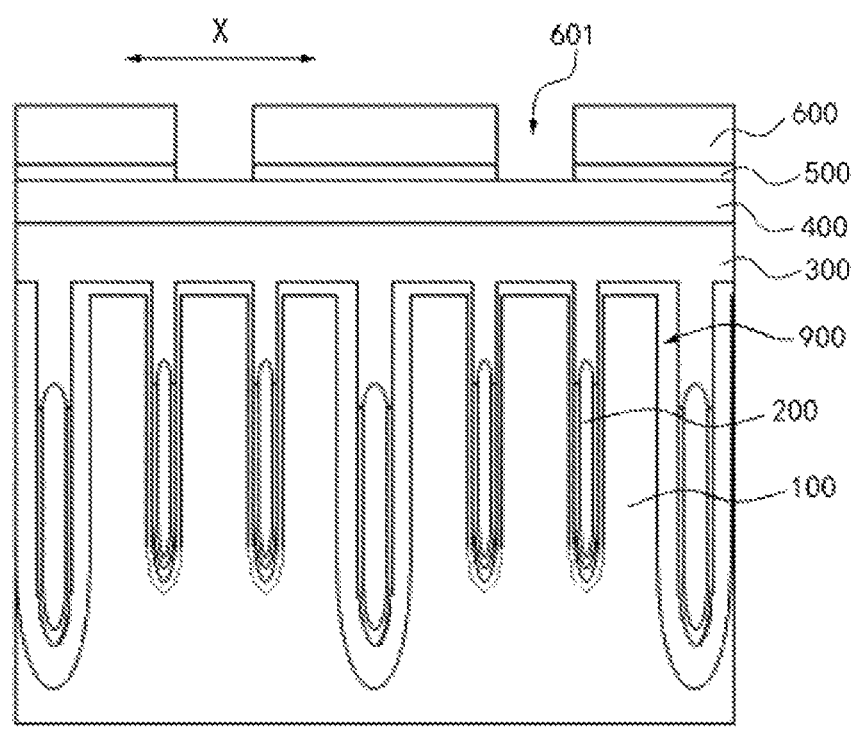
FIG. 3 is a sectional view of a semiconductor structure in the bit line direction in another operation of a method for forming a bit line contact structure according to an example embodiment.
Figure 4:
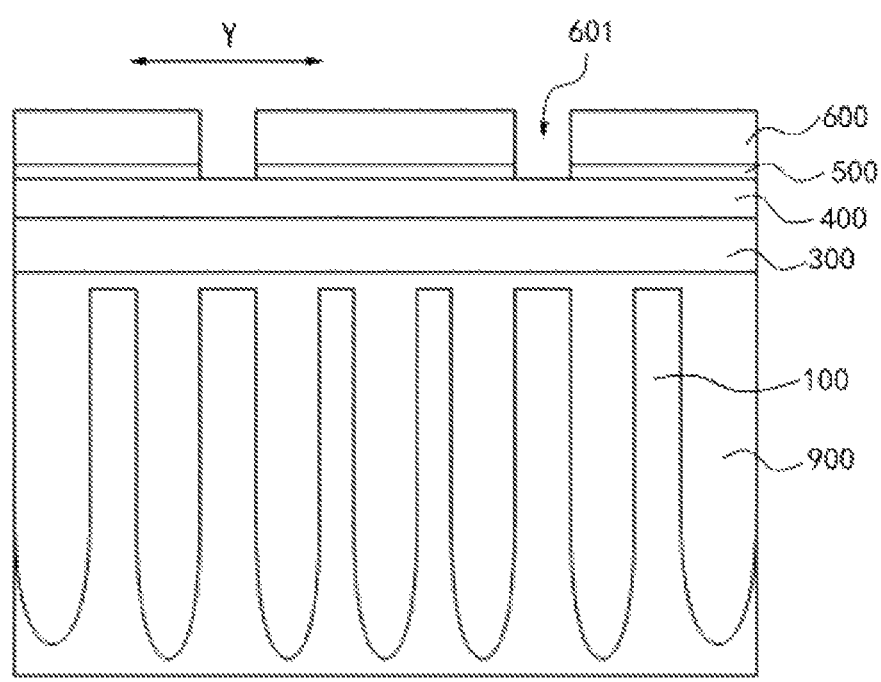
FIG. 4 is a sectional view of the semiconductor structure shown in FIG. 3 in a word line direction.

As shown in FIG. 3 and FIG. 4, sectional structures of the semiconductor structure in the extension direction X of a bit line and in the extension direction Y of a word line 200 in the step of "etching the second mask layer 500 by utilizing the photoresist 600" are typically shown respectively. Specifically, in the above step, the semiconductor structure includes the substrate 100, the first mask layer 400, the second mask layer 500, and the photoresist 600. In this step, the second mask layer 500 is firstly etched by utilizing the patterned photoresist 600, so that part of the second mask layer 500 is removed to form an opening. The opening of the second mask layer 500 corresponds to the photoresist opening pattern 601, and will be a part of the first opening 401 formed in a subsequent process. In other words, the above etching process may also be understood as transferring the photoresist opening pattern 601 to the second mask layer 500.

Optionally, as shown in FIG. 3 and FIG. 4, in this embodiment, as for the step of "etching the second mask layer 500", an etching selection ratio between materials can be controlled by using a plasma etching process or a dry etching process to remove a part of the second mask layer. Specifically, the portion of the second mask layer 500 exposed by the photoresist opening pattern 601 is etched and removed, that is, etching and removing the portion of the second mask layer 500 located below the photoresist opening pattern 601.

Figure 5:
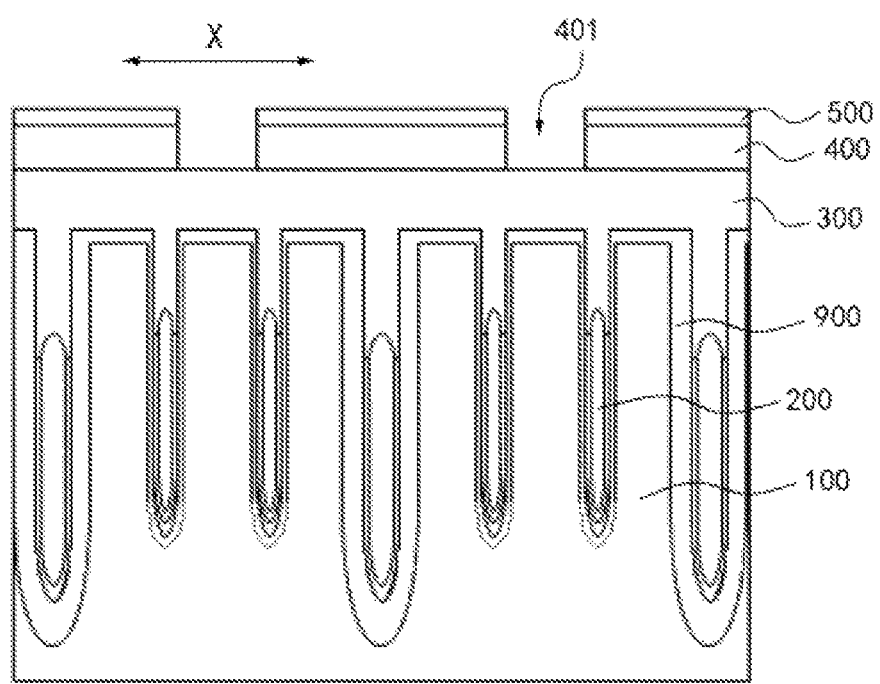
FIG. 5 is a sectional view of a semiconductor structure in the bit line direction in another operation of a method for forming a bit line contact structure according to an exemplary embodiment.
Figure 6:
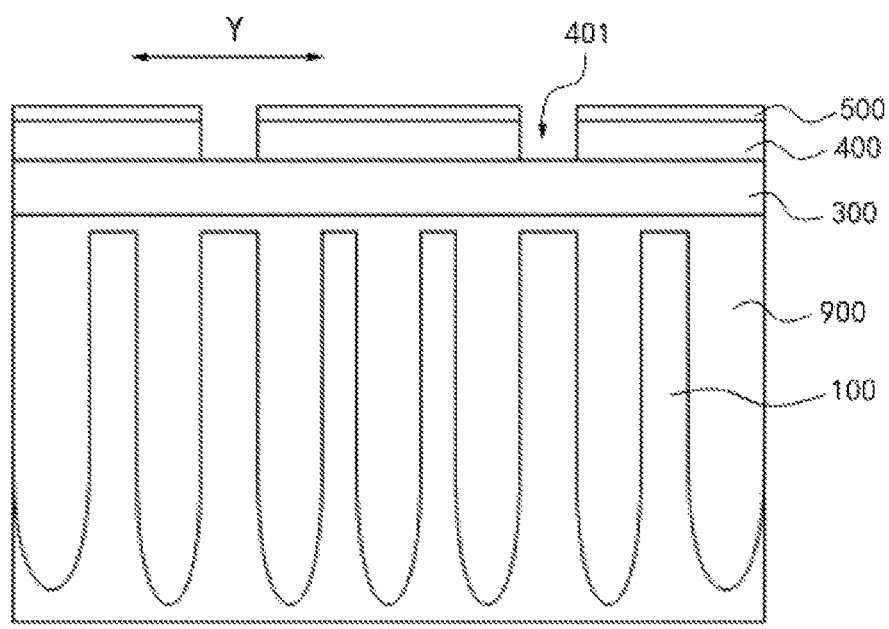
FIG. 6 is a sectional view of the semiconductor structure shown in FIG. 5 in a word line direction.

As shown in FIG. 5 and FIG. 6, sectional structures of the semiconductor structure in the extension direction X of a bit line and in the extension direction Y of a word line 200 in the step of "etching the first mask layer 400 so as to form a first opening 401" are respectively and typically shown. Specifically, in the above step, the semiconductor structure includes the substrate 100, the first mask layer 400, the second mask layer 500, and the photoresist 600. After the second mask layer 500 is etched to form the opening by utilizing the photoresist 600, the first mask layer 400 is continuously etched to remove a part of the first mask layer 400 so as to form an opening. The opening of the first mask layer 400 corresponds to the photoresist opening pattern 601 and the above opening of the second mask layer 500. In other words, the above etching process may also be understood as transferring the opening of the second mask layer 500 to the first mask layer 400. In addition, in the above etching process to the second mask layer 500 and the first mask layer 400, the photoresist 600 is completely consumed and removed. At this time, the respective openings of the second mask layer 500 and the first mask layer 400 jointly define a first opening 401 penetrating the second mask layer 500 and the first mask layer 400.

Optionally, as shown in FIG. 5 and FIG. 6, in this embodiment, as for the step of "etching the first mask layer 400", an etching selection ratio between materials may be controlled by using a plasma etching process or a dry etching process to remove a part of the first mask layer. Specifically, the portion of the first mask layer 400 exposed by the photoresist opening pattern 601 and the second mask layer 500 is etched and removed, and the remaining photoresist 600 is also removed.

Figure 7:
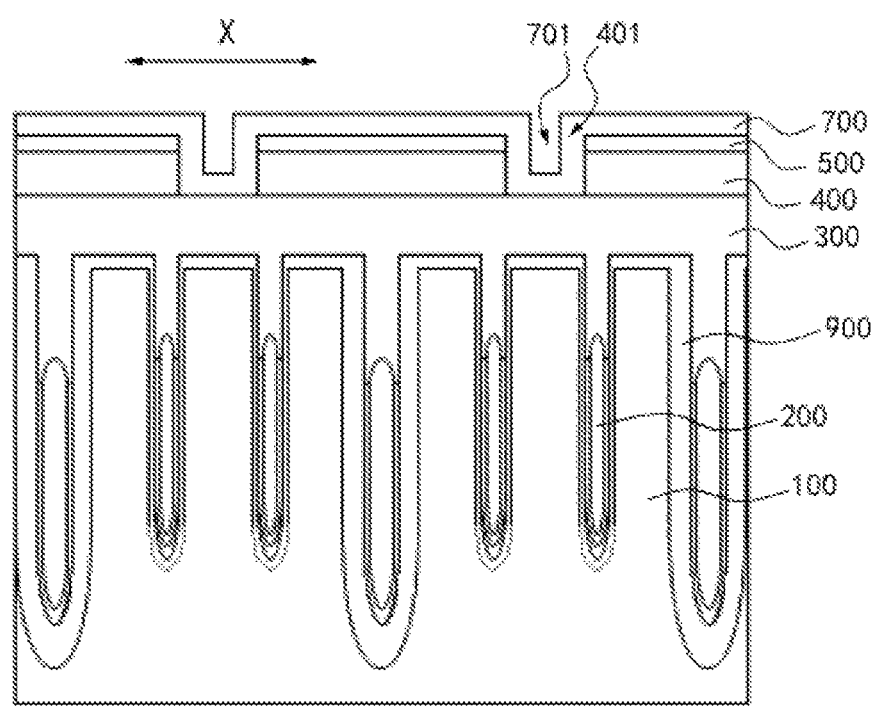
FIG. 7 is a sectional view of a semiconductor structure in the bit line direction in another operation of a method for forming a bit line contact structure according to an exemplary embodiment.
Figure 8:
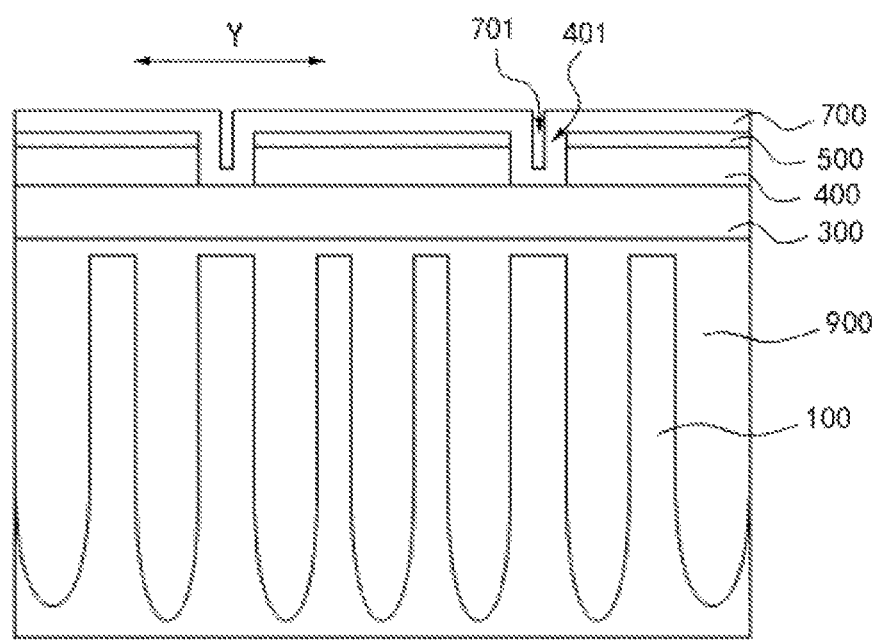
FIG. 8 is a sectional view of the semiconductor structure shown in FIG. 7 in a word line direction.

As shown in FIG. 7 and FIG. 8, sectional structures of the semiconductor structure in the extension direction X of a bit line and in the extension direction Y of a word line 200 in the step of "disposing the sacrificial layer 700 to form a second opening 701" are typically shown respectively. Specifically, in the above step, the semiconductor structure includes the substrate 100, the first mask layer 400, the second mask layer 500, and the sacrificial layer 700. The sacrificial layer 700 covers the surface of the second mask layer 500 and covers sidewalls and the bottom wall of the first opening 401. In addition, the first opening 401 is not filled up by the sacrificial layer 700, so that the part of the sacrificial layer 700 located in the first opening 401 forms the second opening 701, the opening width of which is smaller than the opening width of the first opening 401.

Optionally, as shown in FIG. 7 and FIG. 8, in this embodiment, as for the step of "disposing the sacrificial layer 700", the sacrificial layer 700 may be disposed on the surface of the second mask layer 500 and sidewalls and the bottom wall of the first opening 401 by using a deposition process. Further, the above deposition process may be an atomic layer deposition process.

Optionally, as shown in FIG. 7 and FIG. 8, in this embodiment, as for the step of "disposing the sacrificial layer 700", the opening width of the second opening 701 may be 30% to 70% of the opening width of the first opening 401, such as 30%, 45%, 62%, 70%, etc. In other embodiments, the ratio of the opening width of a second opening 701 to the opening width of a first opening 401 may also be less than 30%, or may be greater than 70%, and less than 100%, such as 28%, 74%, 90%, etc., and the ratio is not limited to this embodiment.

Optionally, as shown in FIG. 7 and FIG. 8, in this embodiment, as for the step of "disposing the sacrificial layer 700", a material of the sacrificial layer 700 may include at least one of $Si_3N_4$ or $SiO_2$.

Figure 9:
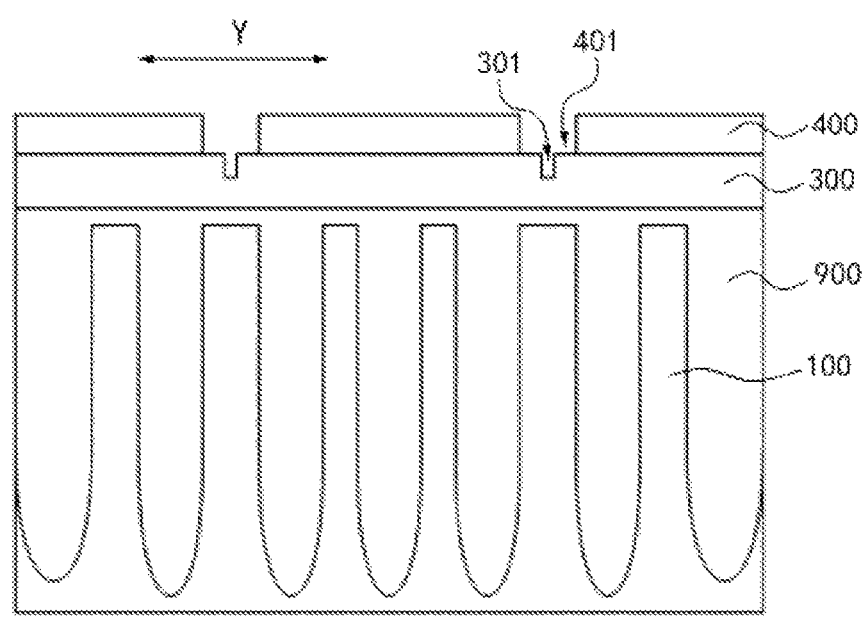
FIG. 9 is a sectional view of a semiconductor structure in the bit line direction in another operation of a method for forming a bit line contact structure according to an exemplary embodiment.
Figure 10:
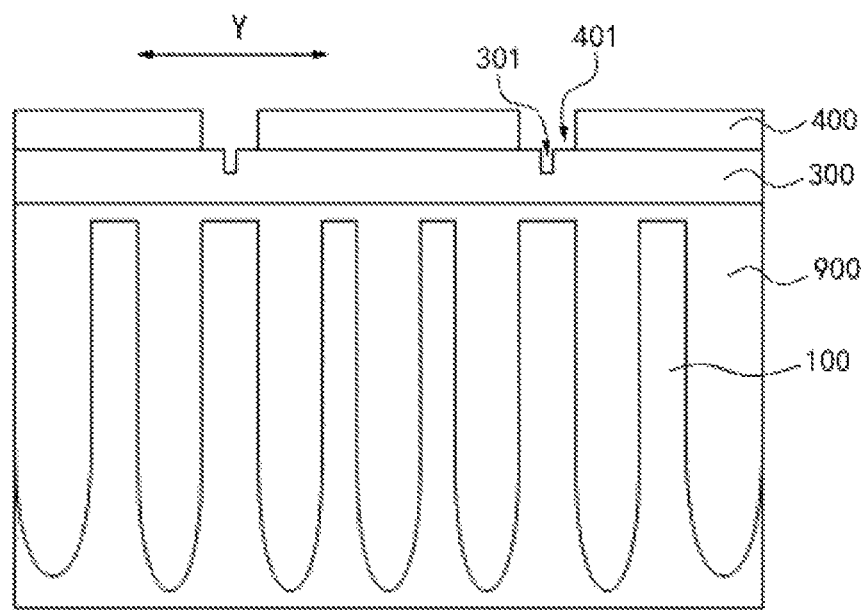
FIG. 10 is a sectional view of the semiconductor structure shown in FIG. 9 in a word line direction.

As shown in FIG. 9 and FIG. 10, sectional structures of the semiconductor structure in the extension direction X of a bit line and in the extension direction Y of a word line 200 in the step of "etching the protection layer 300 so as to form a third opening 301" are respectively and typically shown. Specifically, in the above step, the semiconductor structure includes the substrate 100 and the first mask layer 400. After the second opening 701 is formed, the protection layer 300 on the surface of the substrate 100 is etched by utilizing the second opening 701, and part of the surface of the protection layer 300 is removed to form the third opening 301, which corresponds to the second opening 701. In addition, during the above etching process to the protection layer 300, the remaining sacrificial layer 700 is simultaneously removed to expose the first opening 401. So far, the sacrificial layer 700 is completely consumed and removed. At this time, the second opening 701 and the third opening 301 jointly define an opening space structure shaped like an inverted Chinese character "凸" In other words, the opening of the third opening 301 is formed in the bottom wall of the second opening 701 (the bottom wall of the second opening 701 is formed by the protection layer 300).

Optionally, as shown in FIG. 9 and FIG. 10, in this embodiment, as for the step of "forming the third opening 301", a portion of the surface of the protection layer 300 corresponding to the second opening 701 may be removed by using a self-alignment etching process.

Figure 11:
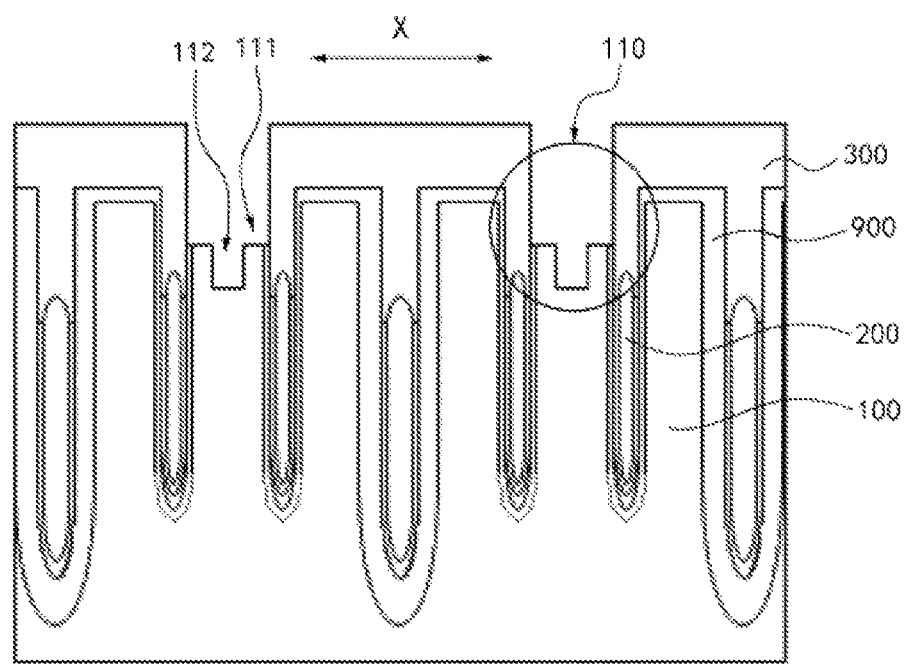
FIG. 11 is a sectional view of a semiconductor structure in the bit line direction in another operation of a method for forming a bit line contact structure according to an exemplary embodiment.
Figure 12:
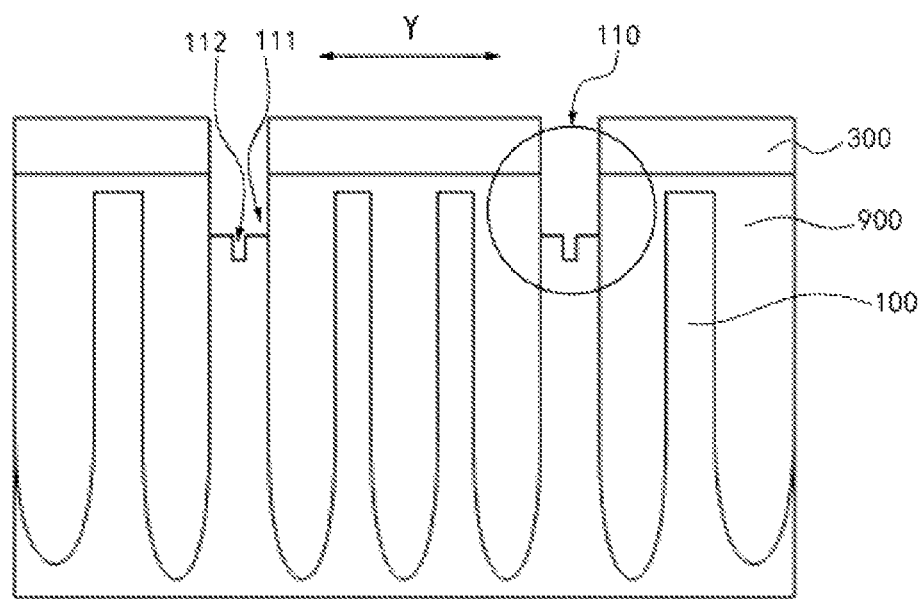
FIG. 12 is a sectional view of the semiconductor structure shown in FIG. 11 in a word line direction.

As shown in FIG. 11 and FIG. 12, sectional structures of the semiconductor structure in the extension direction X of a bit line and in the extension direction Y of a word line 200 in the step of "forming a bit line contact hole 110" are respectively and typically shown. Specifically, in the above step, the semiconductor structure includes the substrate 100. After the third opening 301 is formed, the protection layer 300 and the substrate 100 are etched by utilizing the first opening 401 and the third opening 301 to remove a portion of the protection layer 300 below the first opening 401, partially remove a portion of the substrate 100 below the first opening 401, and partially remove a portion of the substrate 100 below the third opening 301, so as to form the bit line contact hole 110. The bit line contact hole 110 is of an open space structure shaped roughly like an inverted Chinese character "凸". The bit line contact hole 110 includes the first hole portion 111 and the second hole portion 112. The first hole portion 111 opens at the surface of the protection layer 300. The second hole portion 112 opens at the bottom wall of the first hole portion 111. That is, the surface of a remaining part of the substrate 100 located below the first opening 401 forms the bottom wall of the first hole portion 111, and the other opening of the second hole portion 112 is formed at the surface of the substrate 100. In other words, the above etching process may also be understood as transferring the first opening 401 and the third opening 301 to the substrate 100 to form the bit line contact hole 110. According to the above manufacture procedure, it may be seen that the first hole portion 111 roughly corresponds to the first opening 401 (that is, corresponding to the photoresist opening pattern 601), and the second hole portion 112 roughly corresponds to the third opening 301 (that is, the second opening 701). That is, the hole diameter of the second hole portion 112 is smaller than that of the first hole portion 111.

Optionally, based on the corresponding relationships between the first hole portion 111 and the first opening 401 as well as between the second hole portion 112 and the second opening 701, it can be seen that a ratio of the hole diameter of the second hole portion 112 of the bit line contact hole 110 to the hole diameter of the first hole portion 111 is roughly the same as a ratio of the opening width of the second opening 701 to the opening width of the first opening 401. Based on the above description about the ratio of the opening width of the second opening 701 to the opening width of the first opening 401, in this embodiment, the hole diameter of the second hole portion 112 may be 30% to 70% of the hole diameter of the first hole portion 111, such as 30%, 45%, 62%, 70%, etc. In other embodiments, the ratio of the hole diameter of the second hole portion 112 to the hole diameter of the first hole portion 111 may also be less than 30%, or may be greater than 70%, and less than 100%, such as 28%, 74%, 90%, etc., and the ratio is not limited to this embodiment.

Optionally, in this embodiment, as for the step of "forming the bit line contact hole 110", in the extension direction X of a bit line, the hole diameter of the bit line contact hole 110 may be greater than the distance between two adjacent word lines 200.

Optionally, in this embodiment, as for the step of "forming the bit line contact hole 110", in the extension direction Y of a word line 200, the hole diameter of the bit line contact hole 110 may be greater than the width of an active area 800.

Optionally, in this embodiment, as for the step of "forming the bit line contact hole 110", two side walls of the bit line contact hole 110 in the extension direction X of a bit line are respectively defined by the shallow trench isolation 900 on the two sides of the bit line contact hole 110.

Based on the above detailed description of an exemplary embodiment of the method for forming a bit line contact structure provided by the present disclosure, an exemplary embodiment of a semiconductor structure provided by the present disclosure will be described below with reference to FIG. 13.

Figure 13:
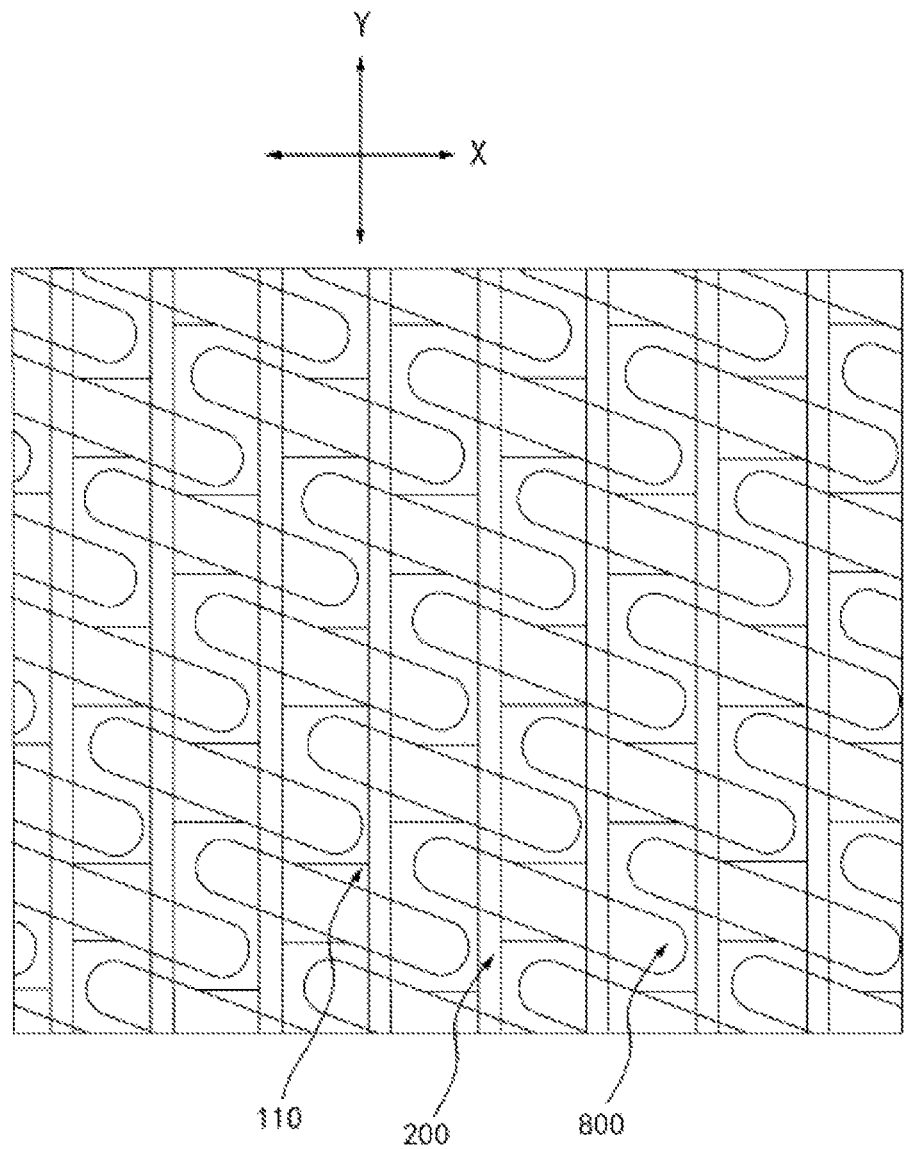
FIG. 13 is a top view of a semiconductor structure according to an exemplary embodiment.

Referring to FIG. 13, a top view of the semiconductor structure provided by the present disclosure is typically shown. In this exemplary embodiment, the semiconductor structure provided by the present disclosure is described by taking a dynamic random access memory device as an example. It is easy for those skilled in the art to understand that, various modifications, additions, substitutions, deletions or other changes may be made to the following specific embodiments in order to apply the relevant design of the present disclosure to other types of semiconductor structures. These modifications, additions, substitutions, deletions still fall within the scope of the principle of the semiconductor structure provided by the present disclosure.

As shown in FIG. 13 and in conjunction with FIG. 11 and FIG. 12, the semiconductor structure provided by the present disclosure includes a substrate 100. A bit line contact structure is formed on the surface of the substrate 100. The bit line contact structure includes a bit line contact hole 110, which contains a first hole portion 111 and a second hole portion 112. An opening of the first hole portion 111 is at the surface of the substrate 100. The hole diameter of the second hole portion 112 is smaller than that of the first hole portion 111. An opening of the second hole portion 112 is at the bottom wall of the first hole portion 111.

Optionally, in this embodiment, the hole diameter of the second hole portion 112 may be 30% to 70% of the hole diameter of the first hole portion 111, such as 30%, 45%, 62%, 70%, etc. In other embodiments, the ratio of the hole diameter of the second hole portion 112 to the hole diameter of the first hole portion 111 may also be less than 30%, or may be greater than 70%, and less than 100%, such as 28%, 74%, 90%, etc., and the ratio is not limited to this embodiment.

Optionally, in this embodiment, in the extension direction X of a bit line, the hole diameter of the bit line contact hole 110 may be greater than the distance between two adjacent word lines 200.

Optionally, in this embodiment, in the extension direction Y of a word line 200, the hole diameter of the bit line contact hole 110 may be greater than the width of an active area 800.

Optionally, in this embodiment, two sidewalls of the bit line contact hole 110 in the extension direction X of a bit line are respectively defined by shallow trench isolation 900 on the two sides of the bit line contact hole 110.

To sum up, according to the method for forming a bit line contact structure provided by the present disclosure, by controlling the shape of a bit line contact hole, the bit line contact hole is formed with a shape of a first hole portion and a second hole portion, and the second hole portion, which opens at the bottom wall of the first hole portion, has a smaller hole diameter than the first hole portion. Accordingly, as for the bit line contact structure formed by the present disclosure, the contact area of the bit line contact hole is increased. The contact resistance is reduced, and the problems in the related art such as short circuit between word lines can be avoided. The present disclosure can improve the product performance of semiconductor structures with a relatively simple manufacturing process and a lower cost.

Although the present disclosure has been described with reference to a few typical embodiments, it should be understood that the terms used are illustrative and exemplary rather than restrictive. Since the present disclosure can be implemented in various forms without departing from the spirit or essence of the present disclosure, it should be understood that the above embodiments are not limited to any of the foregoing details, but should be interpreted broadly within the spirit and scope defined by the appended claims. Therefore, all changes and modifications falling within the scope of the claims or their equivalents shall be covered by the appended claims.

The invention claimed is:

1. A method for forming a bit line contact structure, comprising:
    successively disposing a first mask layer, a second mask layer, and a photoresist on a surface of a substrate, on which a plurality of word lines and a protection layer are provided, and patterning the photoresist to obtain a patterned photoresist;
    successively etching the second mask layer and the first mask layer by utilizing the patterned photoresist, so as to form a first opening penetrating the first mask layer and the second mask layer;
    disposing a sacrificial layer on a surface of the second mask layer, wherein the sacrificial layer covers sidewalls and a bottom wall of the first opening, so as to form a second opening having an opening width smaller than that of the first opening;
    etching a surface of the protection layer to form a third opening corresponding to the second opening by utilizing the second opening, and meanwhile removing the sacrificial layer to expose the first opening; and
    etching through the protection layer by utilizing the first opening and the third opening to form a bit line contact hole at the surface of the substrate, wherein the bit line contact hole is configured to form a bit line contact structure, and the bit line contact hole comprises a first hole portion and a second hole portion, the first hole portion opens at the surface of the protection layer, a hole diameter of the second hole portion is smaller than that of the first hole portion, and the second hole portion opens at a bottom wall of the first hole portion.

2. The method for forming a bit line contact structure according to claim 1, wherein patterning the photoresist is performed by exposing and developing the photoresist to form a photoresist opening pattern from the photoresist.

3. The method for forming a bit line contact structure according to claim 2, wherein etching the second mask layer is performed by removing a portion of the second mask layer exposed by the photoresist opening pattern with a dry etching process.

4. The method for forming a bit line contact structure according to claim 3, wherein etching the first mask layer is performed by removing a portion of the first mask layer exposed by the photoresist opening pattern and the second mask layer with the dry etching process, and removing the patterned photoresist.

5. The method for forming a bit line contact structure according to claim 1, wherein disposing the sacrificial layer is performed by forming the sacrificial layer on the surface of the second mask layer by an atomic layer deposition process.

6. The method for forming a bit line contact structure according to claim 1, wherein etching the protection layer is performed by removing the sacrificial layer and a part of the protection layer by a self-alignment etching process.

7. The method for forming a bit line contact structure according to claim 1, wherein when disposing the sacrificial layer, the opening width of the second opening is 30% to 70% of that of the first opening.

8. The method for forming a bit line contact structure according to claim 1, wherein in an extension direction of a bit line, a hole diameter of the bit line contact hole is greater than a distance between two adjacent ones of the word lines.

9. The method for forming a bit line contact structure according to claim 1, wherein in an extension direction of the word lines, a hole diameter of the bit line contact hole is greater than a width of an active area.

10. The method for forming a bit line contact structure according to claim 1, wherein two sidewalls of the bit line contact hole in an extension direction of a bit line are defined by shallow trench isolation at two sides of the bit line contact hole.

11. The method for forming a bit line contact structure according to claim 1, wherein a material of the first mask layer comprises at least one of $Si_3N_4$ or $SiO_2$.

12. The method for forming a bit line contact structure according to claim 1, wherein the second mask layer comprises an anti-reflection coating.

13. The method for forming a bit line contact structure according to claim 1, wherein a material of the sacrificial layer comprises at least one of $Si_3N_4$ or $SiO_2$.

* * * * *